(12) United States Patent
Roohparvar

(10) Patent No.: US 7,864,587 B2
(45) Date of Patent: Jan. 4, 2011

(54) PROGRAMMING A MEMORY DEVICE TO INCREASE DATA RELIABILITY

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 170 days.

(21) Appl. No.: 12/234,956

(22) Filed: Sep. 22, 2008

(65) Prior Publication Data

US 2010/0074024 A1 Mar. 25, 2010

(51) Int. Cl.
*G11C 16/06* (2006.01)
(52) U.S. Cl. .......................... 365/185.19; 365/185.14; 365/185.26; 365/185.24; 365/185.17
(58) Field of Classification Search ............ 365/185.19, 365/185.14, 185.26, 185.24, 185.17, 189.04
See application file for complete search history.

(56) References Cited

U.S. PATENT DOCUMENTS

2006/0062049 A1* 3/2006 Lee et al. ................ 365/185.22

OTHER PUBLICATIONS

Roohparvar, et al.; Programming a Memory With Varying Bits Per Cell; U.S. Appl. No. 11/765,062, Filed Jun. 19, 2007; Total Pages: 28.

\* cited by examiner

*Primary Examiner*—Thong Q Le
(74) *Attorney, Agent, or Firm*—Leffert Jay & Polglaze, P.A.

(57) ABSTRACT

Methods for programming a memory array, memory devices, and memory systems are disclosed. In one such method, the target reliability of the data to be programmed is determined. The relative reliability of different groups of memory cells of the memory array is determined. The data is programmed into the group of memory cells of the array having a relative reliability corresponding to the target reliability.

23 Claims, 3 Drawing Sheets

US 7,864,587 B2

PROGRAMMING A MEMORY DEVICE TO INCREASE DATA RELIABILITY

TECHNICAL FIELD OF THE INVENTION

The present invention relates generally to memory devices and in a particular embodiment the present invention relates to non-volatile memory devices.

BACKGROUND OF THE INVENTION

Memory devices can include internal, semiconductor, integrated circuits in computers or other electronic devices. There are many different types of memory including random-access memory (RAM), read only memory (ROM), dynamic random access memory (DRAM), static RAM (SRAM), synchronous dynamic RAM (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

As the performance and complexity of electronic systems increase, the requirement for additional memory in a system also increases. However, in order to continue to reduce the costs of the system, the parts count must be kept to a minimum. This can be accomplished by increasing the memory density of an integrated circuit.

Memory density in a non-volatile memory can be increased by using multiple level cells (MLC). MLC memory can increase the amount of data stored in an integrated circuit without adding additional cells and/or increasing the size of the die. The MLC method stores two or more data bits in each memory cell.

MLC, however, requires tighter control of the threshold voltages in order to use multiple states per cell. An MLC memory device typically has a higher bit error rate than a single level cell (SLC) memory device due, in part, to the increased quantity of states requiring more closely spaced threshold voltages. A bad bit in a memory device used to store photographs can be tolerated more easily than a bad bit in a memory device that stores code. A bad bit in a photograph might only produce a bad pixel out of millions of pixels while a bad bit in code or other data could mean a corrupted instruction that affects the operation of an entire program.

For the reasons stated above, and for other reasons stated below that will become apparent to those skilled in the art upon reading and understanding the present specification, there is a need in the art for a memory device having higher density with increased reliability.

DETAILED DESCRIPTION

Figure 1:
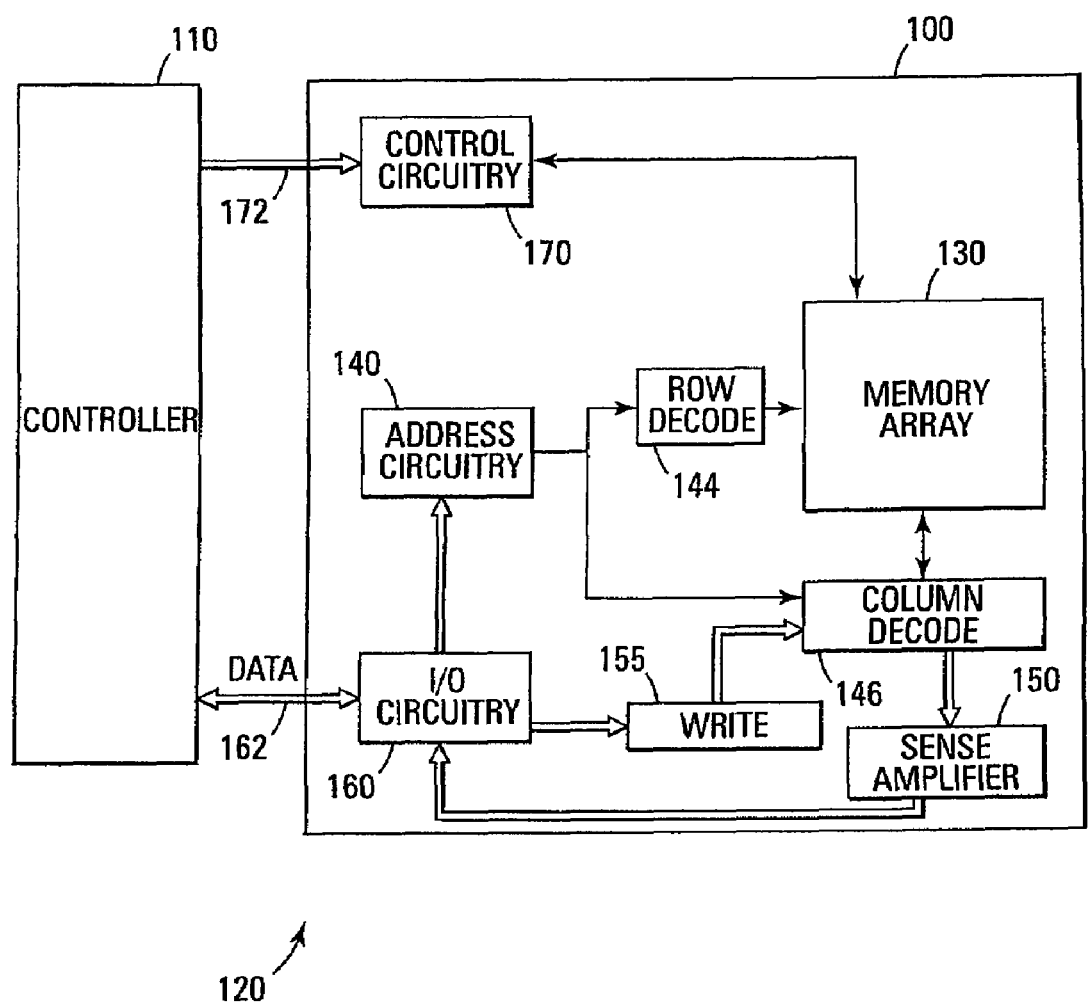
FIG. 1 shows a block diagram of one embodiment of a memory system.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a functional block diagram of a memory system 120 that includes a non-volatile memory device 100. The memory device 100 has been simplified to focus on features of the memory that are helpful in understanding the present programming embodiments. The memory device 100 is coupled to an external controller 110. The controller 110 may be a microprocessor or some other type of control circuitry.

The memory device 100 includes an array 130 of non-volatile memory cells, such as the ones illustrated in FIG. 2 and discussed subsequently. The memory array 130 is arranged in banks of access lines such as word line rows and data lines such as bit line columns. In one embodiment, the columns of the memory array 130 are comprised of series strings of memory cells. As is well known in the art, the connections of the cells to the bit lines determines whether the array is a NAND architecture, an AND architecture, or a NOR architecture.

Address buffer circuitry 140 is provided to latch address signals provided through the I/O circuitry 160. Address signals are received and decoded by a row decoder 144 and a column decoder 146 to access the memory array 130. It will be appreciated by those skilled in the art, with the benefit of the present description, that the number of address input connections depends on the density and architecture of the memory array 130. That is, the number of addresses increases with both increased memory cell counts and increased bank and block counts.

The memory device 100 reads data in the memory array 130 by sensing voltage or current changes in the memory array columns using sense amplifier circuitry 150. The sense amplifier circuitry 150, in one embodiment, is coupled to read and latch a row of data from the memory array 130. Data input and output buffer circuitry 160 is included for bidirectional data communication as well as address communication over a plurality of data connections 162 with the controller 110. Write circuitry 155 is provided to write data to the memory array.

Memory control circuitry 170 decodes signals provided on control connections 172 from the processor 110. These signals are used to control the operations on the memory array 130, including data read, data write (program), and erase operations. The memory control circuitry 170 may be a state machine, a sequencer, or some other type of controller to generate the memory control signals. In one embodiment, the memory control circuitry 170 is configured to perform the programming embodiment illustrated in FIG. 3. The memory control circuitry 170 is further configured to control the reading of data from the memory array 130.

Figure 2:
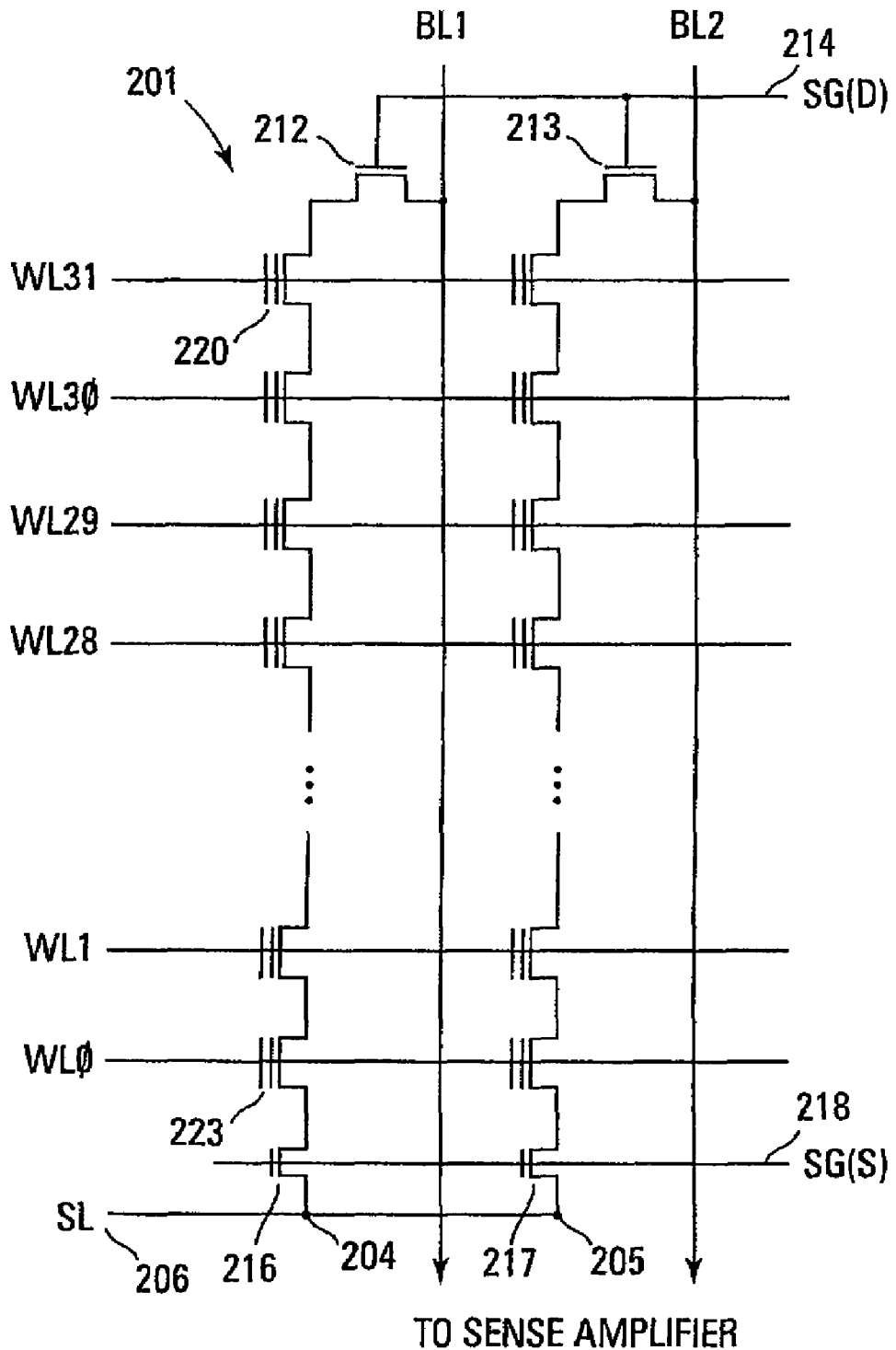
FIG. 2 shows a schematic diagram of one embodiment of a portion of a non-volatile memory array in accordance with the memory array of FIG. 1.

FIG. 2 illustrates a schematic diagram of a portion of a NAND architecture memory array 201 comprising series strings of non-volatile memory cells on which the embodiments of the subsequently discussed data transfer method operate. While the subsequent discussions refer to a NAND memory device, the present embodiments are not limited to such an architecture but can be used in other memory device architectures as well.

The array is comprised of an array of non-volatile memory cells 201 (e.g., floating gate) arranged in columns such as series strings 204, 205. Each of the cells 201 are coupled drain to source in each series string 204, 205. A word line WL0-WL31 that spans across multiple series strings 204, 205 is connected to the control gates of each memory cell in a row in order to bias the control gates of the memory cells in the row. The bit lines BL1, BL2 are eventually connected to sense amplifiers (not shown) that detect the state of each cell by sensing current on a particular bit line.

Each series string 204, 205 of memory cells is coupled to a source line 206 by a source select gate 216, 217 and to an individual bit line BL1, BL2 by a drain select gate 212, 213. The source select gates 216, 217 are controlled by a source select gate control line SG(S) 218 coupled to their control gates. The drain select gates 212, 213 are controlled by a drain select gate control line SG(D) 214.

Each memory cell can be programmed as a single level cell (SLC) or multilevel cell (MLC). Each cell's threshold voltage ($V_t$) is indicative of the data that is stored in the cell. For example, in an SLC, a $V_t$ of 0.5V might indicate a programmed cell while a $V_t$ of −0.5V might indicate an erased cell. The MLC may have multiple $V_t$ ranges that each indicate a different state. Multilevel cells can take advantage of the analog nature of a traditional flash cell by assigning a bit pattern to a specific voltage range stored on the cell. This technology permits the storage of two or more bits per cell, depending on the quantity of voltage ranges assigned to the cell.

Data programmed in the memory cells at the top of the memory strings closest to the drain side and at the bottom of the memory strings closest to the source line has statistically shown a higher bit error rate than data programmed into other areas of the string. Thus, data that requires higher reliability could be programmed into the more central areas of the memory strings. Data that can tolerate a higher bit error rate can be programmed into the upper and lower areas of the memory strings.

Program code typically cannot tolerate errors in programming. One error bit could mean the difference between the program operating properly and not operating at all. Thus, program code would benefit more from being programmed in the higher reliability area of the memory strings.

Image data can typically tolerate a higher error rate. Corrupt image data would mean that some pixels of the image would be missing or not display the proper data. However, in an image of many millions of pixels, a few corrupt pixels would not be noticeable to the average person. Thus, image data can be programmed into the areas of the string with the higher bit error rate.

One aspect of the reliability of a memory cell is determined by how accurately it can be programmed to a target threshold voltage and how well it can then hold that threshold voltage. A memory cell maintaining a target threshold voltage is desired in an MLC device since the programming margins are relatively small compared to SLC memory.

The relative reliability (e.g., bit error rate) of an area of memory is relative in relation to the rest of the memory array. For example, a relatively low reliability area of memory cells has a higher bit error rate than the rest of the memory array. This area could be, as discussed previously, a certain number of word lines that are closer to the drain side of the array and a certain number of word lines that are closer to the source side of the array. Conversely, a relatively high reliability area of memory cells has a lower bit error rate than the rest of the memory array. This area could be the middle area of the array.

Figure 3:
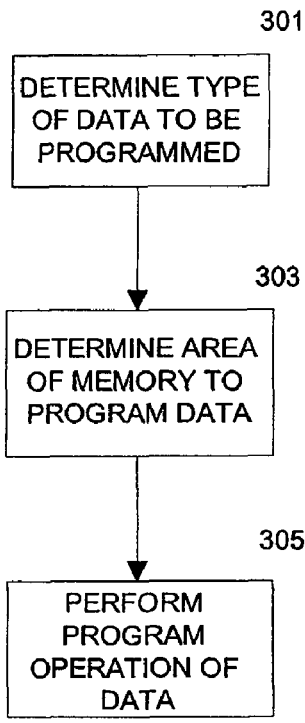
FIG. 3 shows flowchart of one embodiment of a method for programming data in a memory array based on reliability determinations.

FIG. 3 illustrates a flowchart of one embodiment of a method for programming non-volatile memory cells in order to improve programming reliability. This embodiment assumes that the top-most word lines and the bottom-most word lines are the least reliable (e.g., have the highest bit error rate). Alternate embodiments can assume the top two or more word lines and the bottom two or more word lines are the least reliable. Additionally, the quantity of less reliable word lines on the top of the series string does not have to equal the quantity of less reliable word lines at the bottom of the series string.

Referring to FIG. 3, the type of data to be programmed is determined 301. This determination can be done by a controller performing an algorithm to determine whether the data is an image or code. In another embodiment, the user can input an indication of the data type or reliability required.

The area of the memory array to be programmed with the data is then determined based on a target reliability of the data to be programmed 303. As described previously, data requiring a higher reliability is programmed in the more central portion of the memory series strings. Data that can tolerate a higher bit error rate is programmed in the outer portions of the series strings.

The actual programming operation is then performed 305 followed by a verify operation to determine whether the programming was successful. This operation is performed in response to the type of data (e.g., code or image) and the determination of the area of memory to be programmed.

During a typical programming operation of a non-volatile memory cell, a control gate of the selected memory cell to be programmed is biased with a series of incrementing voltage programming pulses. The initial programming pulse starts at an initial voltage that is greater than a predetermined programming voltage (e.g., approximately 16V). Subsequent programming pulses are increased incrementally by a step voltage A verify operation is performed after each programming pulse to determine if the cell's threshold voltage has increased to the target program level. A verify pulse is typically a ramp voltage that biases the selected word lines (i.e., memory control gates) between each programming pulse. The memory cells on the selected word line turn on when the ramp voltage reaches the threshold voltage to which the cells have been programmed. A current flows on the bit lines coupled to the memory cells being programmed when the memory cells turn on. This current flow is detected by sense amplifiers that indicate to comparison circuitry that a comparison operation should be performed to determine if the data stored in the memory cell is equal to the target data.

Figure 4:
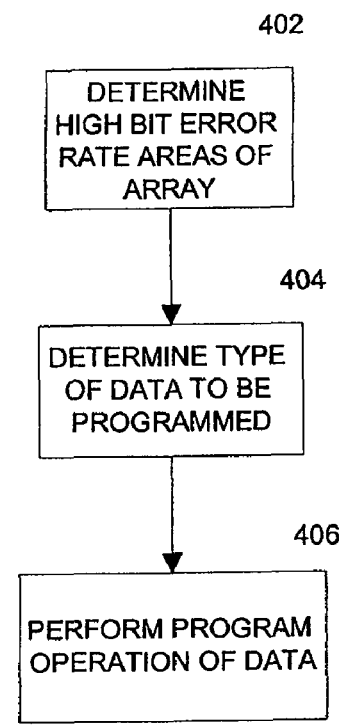
FIG. 4 shows a flowchart of an alternate embodiment of a method for programming data in a memory array based on reliability determinations.

In yet another embodiment, illustrated in the flowchart of FIG. 4, the least reliable word lines of the memory array can be determined by empirical testing of the integrated circuit. This can be accomplished by a series of writing to and reading from different areas of the memory array to determine which areas can be programmed more accurately and which areas hold a charge better. If a word line of memory cells in the middle of the series string turns out to have a higher bit error rate than the other word lines, that particular word line of memory cells is flagged and used for the data that can tolerate the higher error rates.

Referring to FIG. 4, the programming method determines the word lines of memory cells of the array that have a higher bit error rate relative to the other word lines 402. This is accomplished by empirical testing of the memory device.

The type of data to be programmed is also determined 404. As in other embodiments, this can be accomplished by a controller executing an algorithm to determine data type, by user input, or some other data determination method.

The data is then programmed 406 in response to the type of data and the determination of the areas of different reliability of the memory array. The data that can tolerate a higher bit error rate is programmed into the less reliable areas whereas the data that cannot tolerate a high bit error rate is programmed into the more reliable areas of the memory array.

CONCLUSION

In summary, one or more embodiments store data in areas of a memory array based on the target reliability of the data being stored and the relative reliability of the area of memory in which the data is to be stored. Data having a relatively higher reliability target (e.g., program code) is stored in an area of memory found to be more reliable than other areas (e.g., the middle portions of series memory strings). Data having a relatively lower target reliability (e.g., image data) is stored in an area of memory found to be less reliable than other areas (e.g., top and bottom word lines of series memory strings).

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for programming a memory array, the method comprising:
   determining a target reliability of data to be programmed; and
   programming the data into areas of the memory array wherein the areas are determined in response to the target reliability.

2. The method of claim 1 wherein the areas comprise memory cells of the array that are adjacent to a drain side of the array and adjacent to a source line of the array.

3. The method of claim 1 wherein programming comprises generating at least one programming pulse having an initial programming voltage and any subsequent programming pulses are increased by a step voltage over a previous programming pulse.

4. The method of claim 3 wherein each subsequent programming pulse is preceded by a verify pulse.

5. The method of claim 1 wherein the areas comprise memory cells coupled to a top access line of the array and memory cells coupled to a bottom access line of the array.

6. The method of claim 1 wherein the target reliability is determined in response to a type of data to be programmed.

7. The method of claim 6 wherein the type of data comprises one of data and program code.

8. The method of claim 1 wherein determining comprises receiving user input corresponding to an indication of the target reliability.

9. The method of claim 1 wherein determining comprises performing an algorithm to determine the target reliability.

10. A method for programming a memory array, the method comprising:
    determining high bit error rate areas of the memory array;
    determining a type of data to be programmed to the memory array; and
    programming the data to areas of the memory array wherein the areas are determined at least partially in response to the high bit error rate areas and the type of data.

11. The method of claim 10 wherein determining the high bit error rate areas comprises performing empirical testing on the memory array to determine which memory cells cannot accurately hold a charge.

12. The method of claim 11 wherein the empirical testing comprises a series of writing and reading operations to the memory array.

13. The method of claim 11 wherein the empirical testing comprises determining how accurately areas of the memory array can be programmed to a target threshold voltage.

14. The method of claim 10 wherein programming the data comprises programming image data to areas of the memory array having a relatively high bit error rate and programming program code data to areas of the memory array having a relatively low bit error rate.

15. The method of claim 10 and further comprising verifying the programming of the data.

16. A non-volatile memory device comprising:
    a memory array having relatively low reliability areas of memory cells; and
    memory control circuitry for controlling operation of the memory device, the memory control circuitry configured to program the relatively low reliability areas of memory cells with data having relatively low target reliability.

17. The memory device of claim 6 wherein the memory array comprises a NAND architecture.

18. The memory device of claim 16 wherein the memory control circuitry is further configured to program data having a relatively high target reliability to areas of memory cells other than the relatively low reliability areas.

19. The memory device of claim 18 wherein the areas of memory cells having the relatively low target reliability comprise memory cells having a high bit error rate.

20. A memory system comprising:
    a system controller for controlling operation of the memory system with memory signals; and
    a memory device, coupled to the system controller and operating in response to the memory signals, the memory device comprising:
      an array of non-volatile memory cells having a first group of memory cells having relatively low reliability and a second group of memory cells having relatively high reliability; and
      memory control circuitry coupled to the array of memory cells and configured to accept a type of data to be programmed and generate programming signals to program the data into one of the first group of memory cells or the second group of memory cells in response to both the type of data and the relative reliability of the group of memory cells.

21. The memory system of claim 20 wherein the memory control circuitry is further configured to determine the type of data to be programmed.

22. The memory system of claim 21 wherein the memory control circuitry is further configured to determine whether the data to be programmed is image data or program code data.

23. The memory system of claim 22 wherein the image data is programmed into the first group of memory cells and the program code data is programmed into the second group of memory cells.

* * * * *

UNITED STATES PATENT AND TRADEMARK OFFICE
CERTIFICATE OF CORRECTION

PATENT NO. : 7,864,587 B2  Page 1 of 1
APPLICATION NO. : 12/234956
DATED : January 4, 2011
INVENTOR(S) : Frankie F. Roohparvar It is certified that error appears in the above-identified patent and that said Letters Patent is hereby corrected as shown below:

IN THE CLAIMS:
In column 6, line 41, in Claim 17, delete "6" and insert -- 16 --, therefor.

Signed and Sealed this
First Day of March, 2011

David J. Kappos
*Director of the United States Patent and Trademark Office*